United States Patent [19]

Lovendusky et al.

[11] Patent Number: 4,612,699
[45] Date of Patent: Sep. 23, 1986

[54] PRINTED CIRCUIT BOARD FABRICATION APPARATUS

[75] Inventors: Charles M. Lovendusky; Gregory G. White, both of Enola, Pa.

[73] Assignee: E. I. Du Pont de Nemours and Company, Wilmington, Del.

[21] Appl. No.: 660,571

[22] Filed: Oct. 12, 1984

[51] Int. Cl.$^4$ .............................................. H05K 3/30
[52] U.S. Cl. ...................................... 29/739; 29/593; 29/714; 29/845

[58] Field of Search ................. 29/741, 739, 838, 839, 29/705, 715, 593; 81/429, 461; 269/274

[56] References Cited

U.S. PATENT DOCUMENTS 3,322,423 5/1967 Popow et al. ........................ 269/274
4,218,817 8/1980 Takano ................................ 29/715

Primary Examiner—Carl E. Hall

[57] ABSTRACT

An improved anvil for supporting a printed circuit board during insertion of a terminal through the board.

8 Claims, 4 Drawing Figures

U.S. Patent   Sep. 23, 1986   Sheet 1 of 2   4,612,699
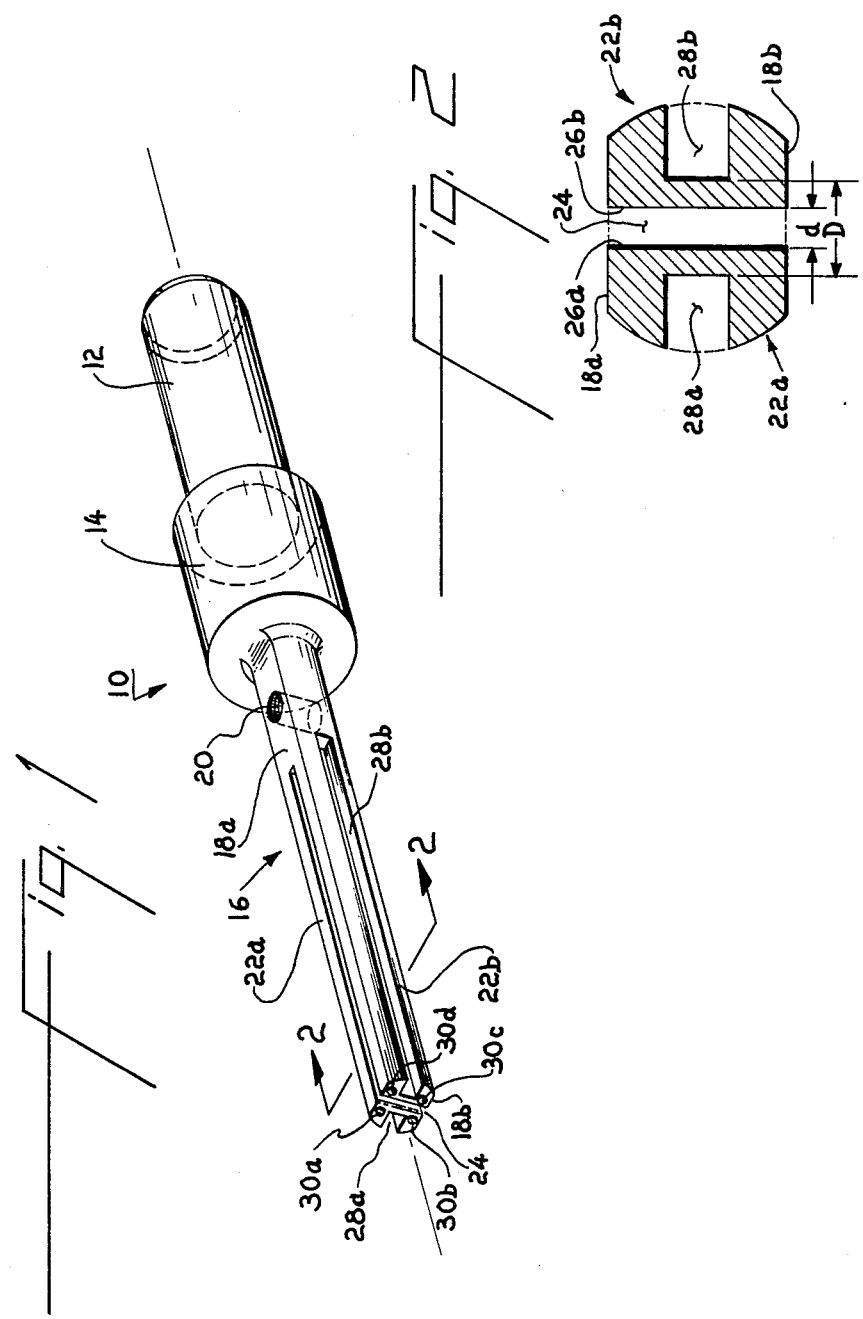

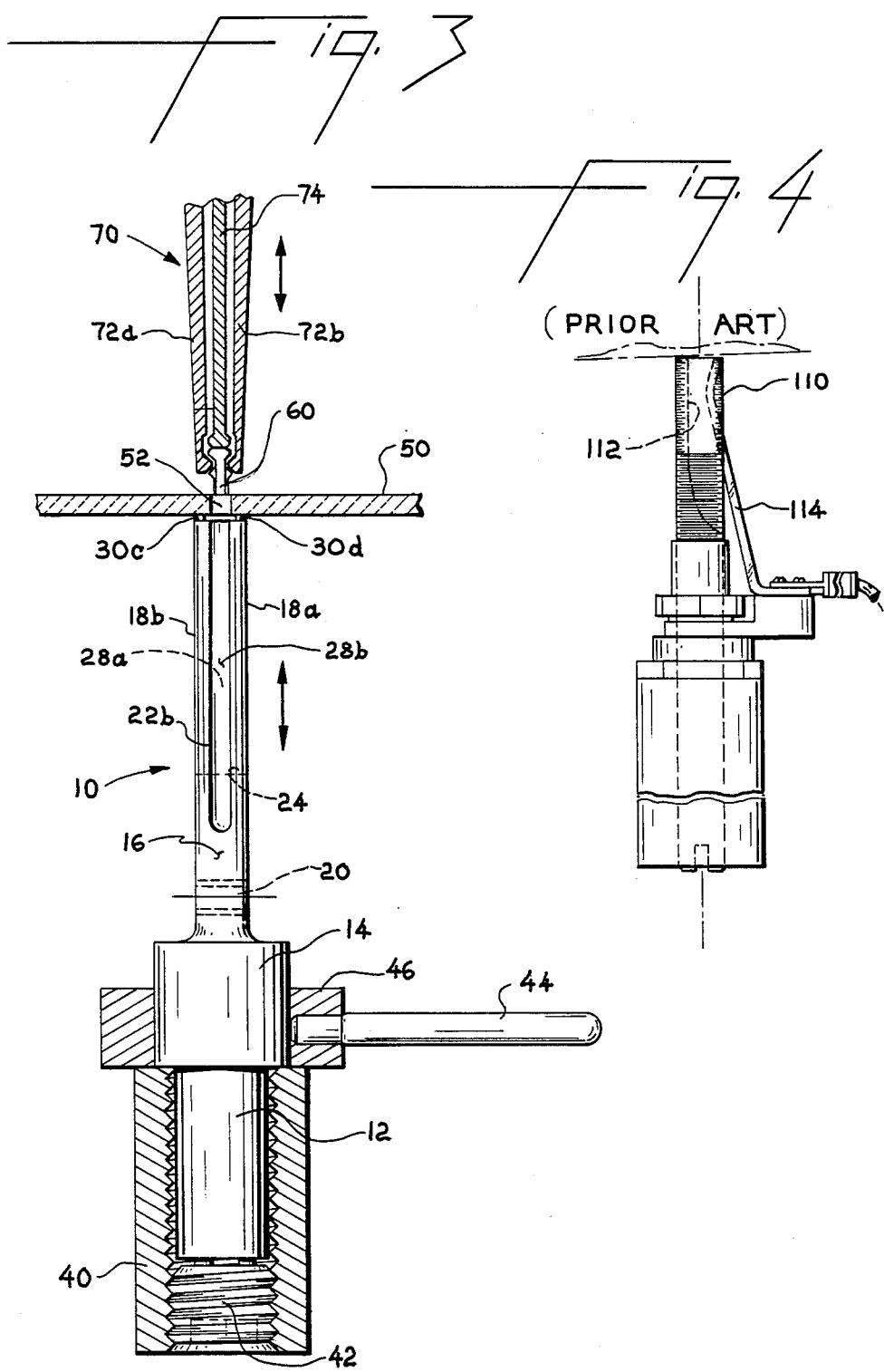

PRINTED CIRCUIT BOARD FABRICATION APPARATUS

BACKGROUND OF THE INVENTION

This invention relates to apparatus for fabricating printed circuit boards, and more particularly to apparatus for inserting terminals into printed circuit board apertures.

One of the steps frequently required in fabricating printed circuit boards ("PCBs") is the insertion of relatively small metal terminal sockets or pins through an aperture in the board. This is often done by means of automatic or semi-automatic terminal inserting machines which hold the PCB at or near its peripheral edges, strip a terminal from a belt or tape containing a succession of terminals, and drive the terminal down through an aperture in the PCB. After each terminal is applied, the machine automatically or semi-automatically indexes the PCB relative to the terminal inserting fixture so that the next PCB aperture requiring a terminal is under the inserting fixture.

Because the terminal inserting machine typically holds and therefore supports the PCB only at its peripheral edges, additional temporary PCB support is usually required at the location at which a terminal is being inserted in order to prevent undue deflection of the PCB as the terminal is inserted. This temporary support has been provided by an anvil assembly which moves up underneath the PCB as the inserting fixture is moving down. However, the known anvil assemblies have several important deficiencies. Among these deficiencies are (1) relatively large anvil size which prevents insertion of closely spaced terminals, (2) anvil surfaces which can damage delicate printed circuitry on the side of the PCB in contact with the anvil, and (3) relatively crude and short-lived structures for detecting the successful insertion of a terminal by electrical continuity through the inserting fixture, the terminal, and the anvil.

In view of the foregoing, it is an object of this invention to improve anvil structures for use in PCB terminal inserting machines.

SUMMARY OF THE INVENTION

This and other objects of the invention are accomplished in accordance with the principles of the invention by means of an anvil having a forked or split upper end portion forming a pair of tines. The gap between the anvil tines is slightly less than the corresponding dimension of a terminal so that when a terminal in the form of a pin or socket is driven through the PCB, the terminal enters the gap between the anvil tines and is pinched between the tines. This assures good electrical contact between the terminal and the anvil for electrical continuity sensing of the terminal. The outer surface of each tine has an axial groove. These grooves and other surface features of the anvil allow the anvil to be used in placing extremely closely spaced terminals. The extreme upper end of the anvil includes a plurality of small plastic bumpers. These bumpers are the anvil components which actually contact the underside of the PCB, and because they are relatively soft and resilient, they are much less likely to damage any printed circuitry on the underside of the PCB than if the metal anvil itself were allowed to contact the PCB. In addition, these bumpers are electrically non-conductive. They therefore electrically insulate the metal anvil from the printed circuitry to prevent false indications of successful terminal insertion.

Further features of the invention, its nature and various advantages, will be more apparent from the accompanying drawings and the following detailed description of the invention.

BRIEF DESCRIPTION OF THE DRAWINGS

FIG. 1 is a perspective view of an illustrative embodiment of the anvil of this invention.

FIG. 2 is a cross sectional view of the anvil taken along the line 2—2 in FIG. 1.

FIG. 3 is a partly sectional, elevational view of the anvil portion of a terminal inserting machine including the anvil of this invention.

FIG. 4 is an elevational view of the anvil portion of a terminal inserting machine including a prior art anvil.

DETAILED DESCRIPTION OF THE INVENTION

As shown in FIGS. 1–3, the anvil 10 of this invention has a lower cylindrical base portion 12, a cylindrical intermediate portion 14, and an upper portion 16, which is also generally cylindrical but which has a number of specially adapted surface features described in detail below. The diameter of base portion 12 is less than that of intermediate portion 14 but greater than that of upper portion 16. All of portions 12, 14, and 16 are coaxial. Anvil 10 (with the exception of plastic bumpers 30) is preferably made from a single piece of hardened steel with a spring quality such as AISI S-7 with a Rockwell hardness of 48–52 C scale.

Two diametrically opposite lateral sides 18a and 18b of upper portion 16 are flattened along the entire length of upper portion 16. Internally threaded aperture 20 is provided through upper portion 16 a short distance above intermediate portion 14. The longitudinal axis of aperture 20 is mutually perpendicular to the longitudinal axis of anvil 10 and the planes of surfaces 18. The longitudinal axis of aperture 20 also intersects the central longitudinal axis of anvil 10. Aperture 20 can be used for attaching an electrical continuity check and test wire to anvil 10 by means of a threaded screw.

Approximately the upper two thirds of the length of upper portion 16 is laterally divided into two longitudinal, bilaterally symmetrical tines 22a and 22b. Tines 22 are separated from one another by axial gap or slot 24, which is coincident with the central longitudinal axis of anvil 10. The length of slot 24 determines contact forces on the terminal being inserted. The opposing surfaces 26a and 26b of tines 22 which define slot 24 are parallel to one another, parallel to the longitudinal axis of anvil 10, and perpendicular to flattened surfaces 18. The perpendicular distance d between surfaces 26 (also referred to herein as the gap between tines 22) is preferably slightly less (e.g., 0.0005 to 0.008 inches) than the corresponding dimension of the terminal 60 to be inserted in the PCB by the inserting machine. Dimension d is the smallest dimension of slot 24.

Each of tines 22 also includes a longitudinal axial groove 28a or 28b, respectively, which extends from the extreme upper end of anvil 10 to a point adjacent the bottom of slot 24. Grooves 28 are formed in the outer, generally cylindrical surface of anvil 10. The depth of each groove 28, measured parallel to dimension d is less than the thickness of the associated tine, also measured parallel to dimension d. Grooves 28 are oriented at right angles to slot 24. The distance D between the bottom surfaces of grooves 28, also measured parallel to dimension d, is greater than d but substantially less than the space between two PCB terminal sites respectively located on diametrically opposite sides of an intermediate third PCB terminal site in the densest terminal arrangement for which anvil 10 is adapted to be used. The width of each groove 28 is substantially greater than the corresponding dimension of a terminal 60 so that a previously applied terminal can fit freely into each groove.

Four plastic bumpers 30a, 30b, 30c, and 30d are mounted on the extreme upper end of anvil 10. In the preferred embodiment, each of bumpers 30 is formed by drilling an axial hole in the upper end of anvil 10 and inserting in each hole a length of monofilament fishing line such as Stren ® fishing line available from E. I. du Pont de Nemours & Co., Inc. of Wilmington, Del. U.S. Pat. No. 3,063,189 relating to Stren ® fishing line is herein incorporated by reference. Each length of fishing line is slightly greater than the depth of the associated hole so that a small amount of plastic material projects above the upper anvil surface. The amount of projection may be approximately 0.02 inches. A small amount of adhesive may be used to help hold each bumper 30 in the associated hole.

In use, anvil 10 is mounted in the conventional vertically reciprocable anvil holder 40 in a conventional terminal inserting machine as shown in FIG. 3. Any of several methods can be used for mounting anvil 10 in holder 40. In the disclosed embodiment, base 12 has a slip fit with the threaded interior of holder 40. The height of anvil 10 relative to holder 40 can be adjusted by set screw 42. Among the possible alternatives to the depicted slip fit mounting of anvil 10 are threading anvil 10 into holder 40 or knurling anvil base 12 and pressing it into holder 40. Anvil 10 is below PCB 50, and the longitudinal axis of anvil 10 is perpendicular to the plane of PCB 50. Anvil 10 is oriented so that surfaces 26 are parallel to one axis along which terminals are to be inserted in PCB 50 and dimensions d and D are parallel to the other axis along which terminals are to be inserted in PCB 50.

Horizontally extending switching rod 44 is mounted on anvil 10 by means of collar 46. Rod 44 activates an electrical switch (not shown) to indicate when anvil 10 is in its lowered position.

Above PCB 50 is a conventional, vertically reciprocable terminal inserting fixture 70, including left and right terminal retainers 72a and 72b for holding terminal 60 as it is moved down toward PCB 50, and shear blade 74 for driving terminal 60 from retainers 72 and through aperture 52 in PCB 50 when fixture 70 reaches the PCB. The upward motion of anvil 10 is synchronized with the downward motion of inserting fixture 70 in the conventional way so that anvil bumpers 30 contact and support PCB 50 as terminal 60 is driven through aperture 52. Bumpers 30 prevent anvil 10 from damaging any printed circuitry on the lower surface of PCB 50 and electrically insulate any printed circuitry on the PCB from the metal portion of the anvil.

As terminal 60 is driven through PCB 50, the lower end of the terminal enters slot 24 and is pinched slightly between anvil tines 22. This is assured by the above-mentioned fact that the spacing d between tines 22 is slightly less than the corresponding dimension (i.e., the diameter or thickness) of terminal 60. Contact between terminal 60 and tines 22 completes an electrical circuit through inserting fixture 70, terminal 60, and anvil 10, thereby indicating that terminal 60 has been successfully inserted through PCB 50. Because slot 24 is aligned with one axis along which terminals are inserted in PCB 50, while surfaces 18 and grooves 28 (dimension D) are aligned with the other (perpendicular) axis along which terminals are inserted in PCB 50, anvil 10 can be used for applying very closely spaced terminals without risk that anvil 10 will push out any previously applied terminals. In the extreme case, one previously applied terminal may extend into groove 28a, another such terminal may extend into groove 28b, and two other such terminals may be respectively adjacent flattened surfaces 18a and 18b, while a final terminal is being inserted in the middle of all of these previously applied terminals.

After each terminal is inserted through PCB 50 as described above, anvil 10 moves down, inserting fixture 70 moves up, and PCB 50 is moved horizontally to position the next terminal site between elements 10 and 70.

The anvil of this invention is a significant improvement over prior art anvils such as the one shown in FIG. 4. That anvil is merely a set screw 110 with a single longitudinal axial slot 112 cut in its side surface. Copper strip 114 is spring-biased toward the bottom of slot 112 so that when a terminal is forced through a PCB above anvil 110, the lower end of the terminal enters slot 112 and deflects copper strip 114, thereby completing an electrical circuit from the inserting fixture, through the terminal, to copper strip 114. The relatively blunt upper end of anvil 110 precludes use of the device for inserting closely spaced terminals. No protective structure is provided on the upper end of anvil 110, so the anvil can contact and may damage printed circuitry on the lower surface of the PCB. And the use of copper strip 114 for electrical continuity testing limits the useful life of the device because of contact contamination and wear.

We claim:

1. An anvil for supporting a printed circuit board during insertion of a terminal through the printed circuit board comprising:

a forked member having two elongated, laterally spaced tines, said tines having parallel, spaced, inner, terminal-pinching surfaces at their board-engaging free ends, said free ends of the tines running surfaces for supporting the printed circuit board said terminal pinching surfaces for receiving and pinching the end of a terminal inserted through the printed circuit board between said spaced surfaces of the tines, and means mounted in the forked member for electrically sensing the presence of a pinched terminal, said tines each having a longitudinal groove in its exterior surface, said grooves being substantially coextensive in length with the tines.

2. The apparatus defined in claim 1 wherein the forked member is made of metal and wherein the perpendicular distance between the inner surfaces of the tines is slightly less than the corresponding dimension of the portion of the terminal received between said inner surfaces so that the terminal is pinched between the tines to complete an electrical circuit including the terminal and the longitudinal member.

3. The apparatus defined in claim 1 wherein the free ends of the tines have projecting insulative plastic bumpers of relatively soft material to prevent the forked member itself from contacting the printed circuit board.

4. The apparatus defined in claim 3 wherein each bumper is a monofilament plastic member mounted in a longitudinal hole in the free end of a tine, the length of the monofilament plastic member being longer than the depth of the associated hole.

5. The apparatus defined in claim 1 wherein the inner surfaces of the tines are planar.

6. The apparatus defined in claim 5 wherein the exterior lateral surfaces of the tines immediately adjacent the ends of said inner surfaces are planar and perpendicular to the planes of said inner surfaces.

7. The apparatus defined in claim 6 wherein the depth of each groove is perpendicular to said inner surfaces, and the width of each groove is substantially greater than the corresponding dimension of a terminal extending through the printed circuit board.

8. The apparatus defined in claim 7 wherein the perpendicular distance between the bottoms of the grooves is less than the distance between two terminal sites respectively located on diametrically opposite sides of an intermediate third terminal site in the printed circuit board.

* * * * *